United States Patent
Lam et al.

(10) Patent No.: US 10,374,556 B2
(45) Date of Patent: Aug. 6, 2019

(54) AMPLIFIER BIASING CIRCUITS AND METHOD

(71) Applicant: SKYWORKS SOLUTIONS, INC., Woburn, MA (US)

(72) Inventors: Lui Lam, Lexington, MA (US); Andrew Raymond Chen, Newton, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/681,733

(22) Filed: Aug. 21, 2017

(65) Prior Publication Data
US 2018/0054169 A1   Feb. 22, 2018

Related U.S. Application Data

(60) Provisional application No. 62/377,712, filed on Aug. 22, 2016.

(51) Int. Cl.
| | |
|---|---|
| *H03F 3/04* | (2006.01) |
| *H03F 1/30* | (2006.01) |
| *H03F 3/195* | (2006.01) |
| *H03F 3/21* | (2006.01) |
| *H03F 3/24* | (2006.01) |

(52) U.S. Cl.
CPC ............. *H03F 1/302* (2013.01); *H03F 3/195* (2013.01); *H03F 3/21* (2013.01); *H03F 3/245* (2013.01); *H03F 2200/411* (2013.01); *H03F 2200/451* (2013.01); *H03F 2203/21127* (2013.01); *H03F 2203/45454* (2013.01)

(58) Field of Classification Search
CPC .............. H03F 3/04; H03F 1/30; H03G 3/30
USPC ........................................ 330/134, 285, 296
See application file for complete search history.

(56) References Cited

U.S. PATENT DOCUMENTS

| | | | |
|---|---|---|---|
| 4,779,057 A * | 10/1988 | Woo ........................ | H03F 1/22 330/149 |
| 7,516,428 B2 | 4/2009 | Fulga et al. | |
| 2013/0344825 A1 | 12/2013 | Ripley et al. | |
| 2016/0191086 A1 * | 6/2016 | Ripley ..................... | H03F 1/56 375/296 |

* cited by examiner

*Primary Examiner* — Steven J Mottola
(74) *Attorney, Agent, or Firm* — Lando & Anastasi, LLP

(57) ABSTRACT

Circuits and methods for adjusting one or more operation parameters of a semiconductor device. One example of a circuit includes a first semiconductor device, a beta sensing circuit coupled to the first semiconductor device and configured to measure a current gain of the first semiconductor device and generate a first control signal based on a value of the current gain of the first semiconductor device, and a reference control circuit coupled to the beta sensing circuit and configured to receive the first control signal and adjust an operation parameter of the first semiconductor device based on the value of the current gain of the first semiconductor device.

25 Claims, 5 Drawing Sheets

AMPLIFIER BIASING CIRCUITS AND METHOD

CROSS-REFERENCE TO RELATED APPLICATIONS

This application claims the benefit under 35 U.S.C. § 119(e) of U.S. Provisional Application No. 62/377,712, titled "AMPLIFIER BIASING CIRCUITS AND METHOD," filed on Aug. 22, 2016 which is herein incorporated by reference in its entirety for all purposes.

BACKGROUND

Elemental devices used in integrated circuits can suffer significant variations in performance as a result of manufacturing conditions, manufacturing processes, operating conditions (both alternating current and direct current operating conditions), and ambient temperatures. In some instances, the basic parameters of a transistor device can suffer from variations of up to ±25% of a nominal value as result of variation due to processing, device aging, or operation outside of design specifications. These variations in performance can make an optimized integrated circuit difficult to design or operate, and may require over-engineering to ensure that operational requirements are maintained.

In particular, variations in manufacturing conditions, operating conditions, and ambient temperatures, can significantly affect a current gain (also referred to as "beta") of one or more bipolar transistor devices within an amplifier, such as a radio-frequency power amplifier. Such variations can cause the current gain values to differ between each transistor device, and in some instances, change over time for a single transistor device. As most radio-frequency power amplifiers are sensitive to the current gain of included transistor devices, fluctuations can have a significant impact on amplifier performance, and can make optimal frequency performance difficult to achieve. For example, within a radio-frequency power amplifier, variations in the current gain can cause an adverse effect in the radio-frequency performance of the transistor devices, and can cause an operating point of the transistor device(s) to shift, both of which are undesirable.

SUMMARY

Aspects and examples relate to electronic systems and, in particular, to amplifiers, such as power amplifiers, radio-frequency power amplifiers, and low-noise amplifiers. Various aspects and examples provide circuits and methods for adjusting one or more operation parameters of a semiconductor device associated with a radio-frequency power amplifier, such as a transistor device, based on an on-chip measured value of the current gain (also referred to as "beta") of that transistor device.

According to an aspect, an integrated circuit is provided. In one example, the integrated circuit comprises a first semiconductor device, a beta sensing circuit coupled to the first semiconductor device and configured to measure a current gain of the first semiconductor device and generate a first control signal based on a value of the current gain of the first semiconductor device, and a reference control circuit coupled to the beta sensing circuit and configured to receive the first control signal and adjust an operation parameter of the first semiconductor device based on the value of the current gain of the first semiconductor device.

In an example, the first semiconductor device is a bipolar junction transistor. In one example, the bipolar junction transistor is an NPN-type bipolar junction transistor. In an example, the reference control circuit is a biasing circuit integrated within a shared substrate with the NPN-type bipolar junction transistor, the biasing circuit being configured to adjust a direct current operating point of the NPN-type bipolar junction transistor. In one example, the biasing circuit is configured to adjust a variable collector current of the NPN-type bipolar junction transistor to adjust the direct current operating point of the NPN-type bipolar junction transistor. In an example, the NPN-type bipolar junction transistor is a common-emitter NPN-type bipolar junction transistor integrated within a radio-frequency signal path of an output stage of a radio-frequency power amplifier.

In one example, the beta sensing circuit is configured to continuously measure the current gain of the first semiconductor device. In an example, the reference control circuit is configured to continuously adjust the operation parameter of the first semiconductor device based on the value of the continuously measured current gain of the first semiconductor device. In an example, the beta sensing circuit is configured to periodically measure the current gain of the first semiconductor device. In one example, the reference control circuit is configured to periodically adjust the operation parameter of the first semiconductor device based on the value of the periodically measured current gain of the first semiconductor device.

In an example, the integrated circuit further comprises a second semiconductor device, and the beta sensing circuit is further configured to measure a current gain of the second semiconductor device and generate a second control signal based on a value of the current gain of the second semiconductor device. In one example, the reference control circuit is further configured to receive the second control signal and adjust an operation parameter of the second semiconductor device based on the value of the current gain of the second semiconductor device, the second control signal being different from the first control signal. In an example, the reference control circuit is configured to provide at least one of a current and a voltage to the first semiconductor device.

According to an aspect, provided is a radio-frequency power amplifier circuit. In one example, the radio-frequency power amplifier circuit comprises an input path configured to receive an input radio-frequency signal, an integrated circuit coupled to the input path and configured to generate an amplified radio-frequency signal, the integrated circuit including at least a first circuit stage coupled to a second circuit stage, the first circuit stage having a first semiconductor device and the second circuit stage having a second semiconductor device, at least one beta sensing circuit configured to measure a first current gain of the first semiconductor device, generate a first control signal based on a value of the first current gain, measure a second current gain of the second semiconductor device, and generate a second control signal based on a value of the second current gain, at least one reference control circuit configured to receive the first control signal and the second control signal, adjust a first operation parameter of the first semiconductor device based on the value of the first current gain, and adjust a second operation parameter of the second semiconductor device based on the value of the second current gain, and an output path coupled to the integrated circuit and configured to provide the amplified radio-frequency signal.

In one example, the first control signal is different from the second control signal. In an example, the first circuit stage and the second circuit stage are integrated within a shared substrate of the integrated circuit. In one example, the first semiconductor device is a first bipolar junction transistor and the second semiconductor device is a second bipolar junction transistor. In an example, the first bipolar junction transistor includes a first NPN-type bipolar junction transistor and the second bipolar junction transistor includes a second NPN-type bipolar junction transistor. In an example, the reference control circuit is a biasing circuit configured to adjust a first direct current operating point of the first NPN-type bipolar junction transistor and adjust a second direct current operating point of second NPN-type bipolar junction transistor. In an example, the at least one biasing circuit is configured to adjust a first variable collector current of the first NPN-type bipolar junction transistor to adjust the first direct current operating point, and adjust a second variable collector current of the second NPN-type bipolar junction transistor to adjust the second direct current operating point.

In one example, radio-frequency power amplifier circuit further comprises a predistortion circuit coupled to at least the at least one beta sensing circuit and configured to cancel a non-linear effect of the radio-frequency power amplifier circuit in response to receiving at least one of the first control signal and the second control signal. In an example, the radio-frequency power amplifier circuit further comprises an envelope tracking circuit coupled to at least the at least one beta sensing circuit and configured to cancel a non-linear effect of the radio-frequency power amplifier circuit in response to receiving at least one of the first control signal and the second control signal.

According to an aspect, provided is an amplifier biasing method. In one example, the amplifier biasing methods comprises measuring a current gain of at least one bipolar junction transistor integrated within a radio-frequency signal path of an output stage of a radio-frequency power amplifier, generating a control signal based on a value of the current gain of the at least one bipolar junction transistor, and adjusting an operation parameter of the at least one bipolar junction transistor at least based on the value of the current gain, responsive to receiving the control signal.

In an example, adjusting an operation parameter of the at least one semiconductor device includes adjusting a direct current operating point of the bipolar junction transistor. In one example, adjusting the direct current operating point of the bipolar junction transistor includes adjusting at least one of a current and a voltage provided to the bipolar junction transistor. In an example, adjusting at least one of a current and a voltage provided to the bipolar junction transistor includes adjusting a variable collector current of the bipolar junction transistor.

In one example, measuring the current gain of the bipolar junction transistor includes continuously measuring the current gain of the bipolar junction transistor. In an example, measuring the current gain of the bipolar junction transistor includes periodically measuring the current gain of the bipolar junction transistor.

According to another aspect, provided is a module. In one example, the module comprises a beta sensing circuit coupled to a bipolar junction transistor and configured to measure a current gain of the bipolar junction transistor and generate a control signal based on a value of the current gain of the bipolar junction transistor, and a reference control circuit coupled to the beta sensing circuit and configured to receive the control signal and adjust an operation parameter of the bipolar junction transistor based on the value of the current gain of the bipolar junction transistor.

In an example, the beta sensing circuit is configured to continuously measure the current gain of the bipolar junction transistor. In one example, the beta sensing circuit is configured to periodically measure the current gain of the bipolar junction transistor. In one example, the module further comprises the bipolar junction transistor, the bipolar junction transistor including a NPN-type bipolar junction transistor integrated within a radio-frequency signal path of an output stage of a radio-frequency power amplifier. In an example, the reference control circuit is a biasing circuit configured to adjust a direct current operating point of the NPN-type bipolar junction transistor. In one example, the biasing circuit is configured to adjust a variable collector current of the NPN-type bipolar junction transistor to adjust the direct current operating point of the NPN-type bipolar junction transistor.

In one example, the value of the current gain is a first value of the current gain associated with a first operating condition. In an example, the beta sensing circuit is further configured to generate a second control signal based on a second value of the current gain of the bipolar junction transistor, the second value of the current gain being associated with a second operating condition and being different than the first operating condition.

According to one aspect, provided is a wireless device. In one example, the wireless device comprises a transceiver configured to generate a radio-frequency signal, a power amplifier circuit having at least one semiconductor device and being configured to provide an amplified radio-frequency signal, a module electrically coupled to the power amplifier circuit, the module including a beta sensing circuit and a reference control circuit, and an antenna in communication with the module, the antenna configured to transmit the amplified radio-frequency signal. In one example, the beta sensing circuit includes the beta sensing circuit discussed above. In an example, the reference control circuit includes the reference control circuit discussed above.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1:
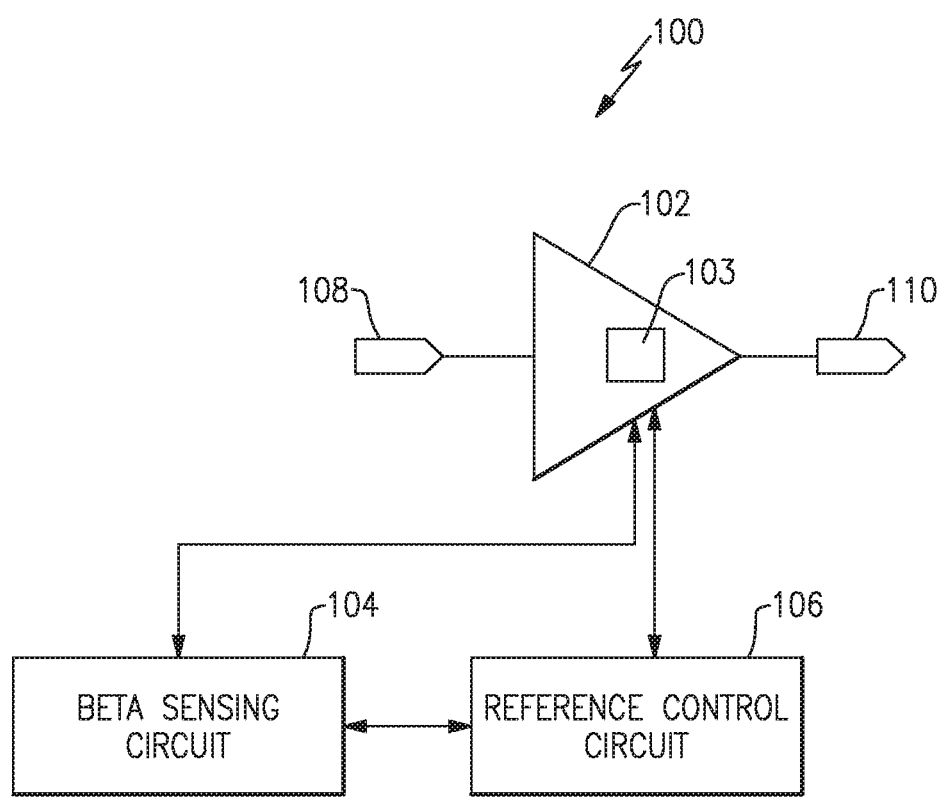
FIG. 1 is a block diagram of one example of an integrated circuit according to various aspects described herein.

Aspects and examples relate to electronic systems and, in particular, to amplifiers, such as radio-frequency power amplifiers. Although certain embodiments of the present disclosure are primarily directed to radio-frequency power amplifiers, other aspects of the present disclosure may be used in any amplifier that includes bipolar transistors in an output stage thereof. Specifically, aspects of the present disclosure may be used in other types of amplifiers not used for amplifying radio-frequency signals, such as low-noise amplifiers and other power amplifiers.

Certain aspects and embodiments provide circuits and methods for adjusting one or more operation parameters of a semiconductor device (e.g., transistor) based on a measured value of a current gain thereof (also referred to as "beta"). Specifically, various aspects and embodiments may include an on-chip beta sensing circuit and an on-chip reference control circuit coupled to the semiconductor device and configured to adjust a direct current operating point of the semiconductor device based on a continuously, dynamically, periodically, and/or on-demand measured value of the current gain, without external intervention.

As discussed above, the performance of a radio-frequency power amplifier, low noise amplifier, or other amplifier device, is largely sensitive to the value of current gain of one or more semiconductor devices included therein. Due to manufacturing variations, operating conditions, and ambient temperatures, the current gain of a given semiconductor device is often not a constant value, and may vary over time. Furthermore, the current gain of a first semiconductor device may be different from that of a second semiconductor device despite both being included within the same integrated circuit. Understandably, the change in current gain from one device to another, or one integrated circuit to another, can make design of an optimized radio-frequency power amplifier challenging. In instances where a radio-frequency power amplifier includes a plurality of semiconductor devices, such as when the amplifier has a plurality of amplifier stages, variations in the current gain of each particular semiconductor device can have a significant effect on the frequency performance of the power amplifier, in terms of linearity, signal to noise ratio, power consumption, etc. In some instances, variations may cause undesirable non-linear effects in an amplified output signal. Specifically, variations in current gain can cause an operating point of the one or more semiconductor devices to change, and can cause the radio-frequency behavior of the one or more devices to change.

Due to these limitations, different design techniques have been proposed to stabilize radio-frequency power amplifier performance over a range of current gain values. Specifically, these techniques have suggested circuit architectures to substantially isolate the power amplifier, and associated semiconductor devices, from variations in current gain by stabilizing the operating point of the associated semiconductor devices. For example, base current correction (e.g., using a beta-helper circuit) and device sizing and scaling optimization have been proposed to maintain the operating point at a predetermined value despite current gain fluctuations. However, these approaches require selection of an operating point that produces acceptable performance results for the extremes of all manufacturing variations, variations in operating conditions, and variations in temperature (e.g., across all process corners). While improving performance when compared to conventional radio-frequency power amplifier arrangements, such design approaches necessarily require selection of an operating point that is a compromise between design parameters, such as linearity, signal to noise ratio, power consumption, etc. Furthermore, such approaches fail to address the undesirable effects that variations in current gain may have on the radio-frequency behavior of the radio-frequency power amplifier.

Accordingly, various aspects and embodiments discussed herein adjust an operating point of one or more semiconductor devices associated with a radio-frequency power amplifier, or other amplifier device, to achieve optimized performance for various current gain values despite value fluctuations, while also minimizing the effects such variations may have on the radio-frequency performance of the one or more semiconductor devices and/or the radio-frequency power amplifier. Specifically, aspects and embodiments may include an on-chip beta sensing circuit configured to continuously, dynamically, periodically, and/or on-demand, measure a value of the current gain without external intervention. Aspects and embodiments may further include an on-chip reference control circuit coupled to the semiconductor device and configured to adjust an operating point of the semiconductor device based on the measured value of the current gain. This capability may be highly desirable in numerous applications. For example, in many communication transceivers it is desirable that component devices exhibit stable performance over a wide variety of operating conditions and ambient conditions. Particular examples may be used to mitigate a device trauma event, such as an over-voltage. Aspects and embodiments of the beta sensing circuit and reference control circuit can meet these objectives for a range of such conditions, providing optimized performance regardless of the condition. Accordingly, various aspects and examples disclosed herein may provide important functionality that is not available from conventional radio-frequency power amplifiers and/or other amplifier devices, and that does not require a compromise across process corners.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1 is a block diagram of one example of an integrated circuit 100 configured to adjust an operation parameter (e.g., direct current operating point) of at least one radio-frequency power amplifier 102 based on a measured current gain of a component thereof. In various embodiments, the integrated circuit 100 includes a beta sensing circuit 104 and a reference control circuit 106. Each of the beta sensing circuit 104 and the reference control circuit 106 are coupled to a semiconductor device 103 within the radio-frequency power amplifier 102. As discussed in further detail below with reference to at least FIG. 2 and FIG. 3, in various examples the semiconductor device 103 includes a transistor device, such as a bipolar junction transistor. In particular, the semiconductor device 103 may include a common-emitter bipolar junction transistor integrated within a radio-frequency signal path of an output stage of the radio-frequency power amplifier 102.

The illustrated radio-frequency power amplifier 102 may be configured to receive a radio-frequency signal at an input signal path 108, amplify the radio-frequency signal, and provide an amplified radio-frequency signal at an output signal path 110. For example, the radio-frequency power amplifier 102 may be used to boost the strength of a radio-frequency signal having a relatively low power. In various embodiments, the amplified radio-frequency signal may be used for various purposes, such as driving the antenna of a wireless device. Accordingly, the radio-frequency power amplifier 102 may be included in numerous devices in which management of a radio-frequency signal is important, such as a mobile phone.

In certain embodiments, the beta sensing circuit 104 is coupled to the semiconductor device 103 and configured measure a current gain thereof. The beta sensing circuit 104 is coupled to the reference control circuit 106, which receives one or more control signals from the beta sensing circuit 104 based at least in part on the value of the measured current gain. In the example of FIG. 1, the reference control circuit 106 is coupled to the semiconductor device 103 and configured to adjust an operation parameter of the semiconductor device 103 based on (e.g., as a function of) the value of the current gain of the semiconductor device 103. It will be understood by those skilled in the art that additional elements (not illustrated) can be included within the integrated circuit 100 of FIG. 1 and/or a sub-combination of the illustrated elements can be implemented.

Though the components of several views of the drawings herein may be shown and described as discrete elements in a block diagram and may be referred to as "circuitry," unless otherwise indicated, the elements may be implemented as one of, or a combination of, analog circuitry, digital circuitry, or one or more microprocessors executing software instructions. Unless otherwise indicated, signal lines may be implemented as discrete analog or digital signal lines. Some of the processing operations may be expressed in terms of calculating, determining, and/or ascertaining. The equivalent of calculating, determining, and/or ascertaining can be performed by other analog or digital processing techniques and are included within the scope of this application. Unless otherwise indicated, signals may be encoded in either digital or analog form; conventional digital-to-analog or analog-to-digital converters may not be shown in the drawings.

Figure 2:
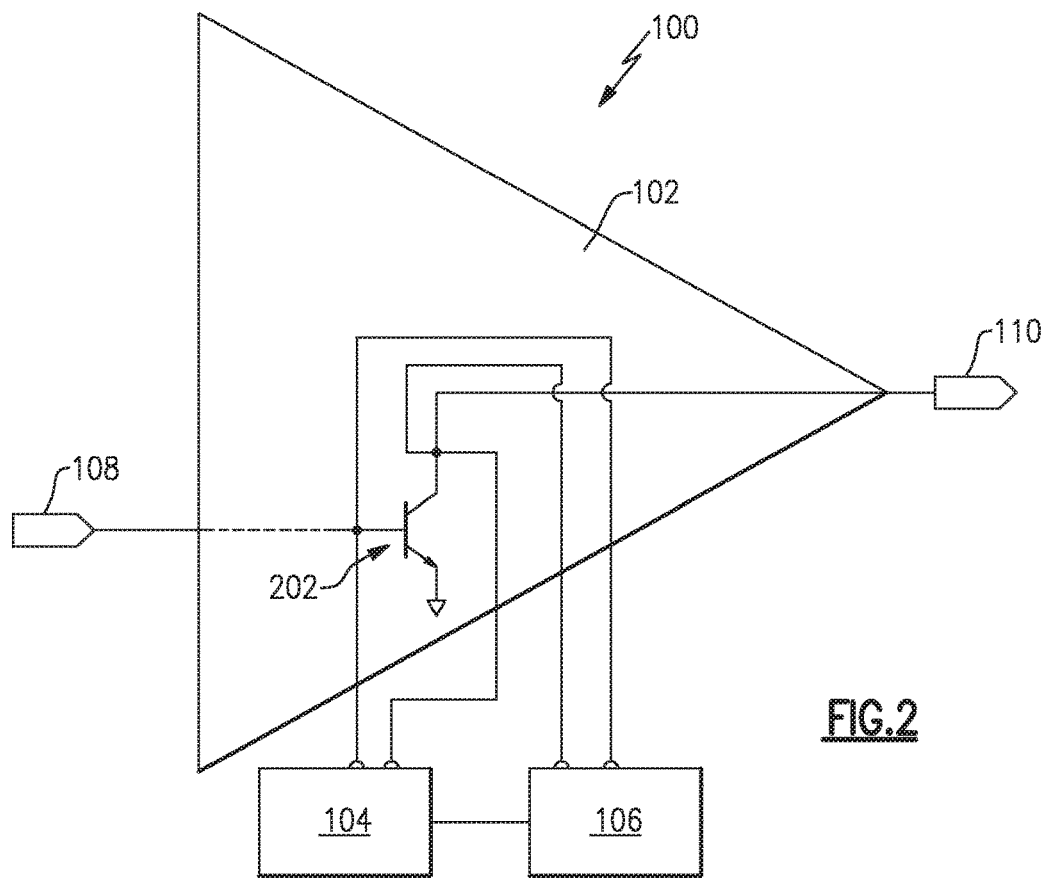
FIG. 2 is a circuit diagram of the example integrated circuit of FIG. 1, according to various aspects described herein.

FIG. 2 is a circuit diagram of the example integrated circuit 100 of FIG. 1, according to various aspects and examples. FIG. 2 is described with continuing reference to FIG. 1. In the illustrated example, the amplifier 102 includes a radio-frequency signal route from the input path 108 to the output path 110. Along the radio-frequency signal route, the radio-frequency power amplifier 102 may include one or more radio-frequency components, such as the at least one semiconductor device 103 of the radio-frequency power amplifier 102 shown in FIG. 1. In various embodiments, a radio-frequency signal applied along the radio-frequency signal route is amplified by the semiconductor device 103. In the example of FIG. 2, the semiconductor device 103 is illustrated as a transistor device, and in particular, a bipolar junction transistor 202. In the illustrated example, a base terminal of the bipolar junction transistor 202 is electrically coupled to the input path 108 of the radio-frequency power amplifier 102, a collector terminal is electrically coupled to the output path 110 of the radio-frequency power amplifier 102, and an emitter terminal of the bipolar junction transistor 202 is coupled to a signal ground, typically via a resistor (not shown). In various further examples, the bipolar junction transistor 202 is positioned within an output stage of the radio-frequency power amplifier 102. Accordingly, the radio-frequency power amplifier 102 may include additional circuit components interposed between the input path 108 and the bipolar junction transistor 202. These additional circuit components have been omitted from FIG. 2 for the convenience of description. As further discussed with reference to FIG. 1, the beta sensing circuit 104 and the reference control circuit 106 are electrically coupled to each other and to the bipolar junction transistor 202.

In various embodiments, the beta sensing circuit 104 measures a current gain of the bipolar junction transistor 202 and generates a corresponding control signal based at least in part on the value of the current gain measured. As will be understood to those skilled in the art, the current gain (i.e., common-emitter current gain, also known as "beta") refers to the approximate ratio of the direct current electrical current at the collector terminal of the bipolar junction transistor 202 and the direct current electrical current at the base terminal of the bipolar junction transistor 202, during operation. In at least one example, and as illustrated, the bipolar junction transistor 202 includes an NPN-type bipolar junction transistor. NPN-type bipolar junction transistors offer the benefit of an amplified collector current and emitter current, relative to a respectively small current applied to the base terminal. Accordingly, in various embodiments the beta sensing circuit 104 includes one of a current sensing circuit, voltage sensing circuit, or charge sensing circuit coupled to the bipolar junction transistor 202 and configured to measure the ratio of the collector current and the base current of the bipolar junction transistor 202.

Often, the current gain of the bipolar junction transistor 202 will vary during operation of the integrated circuit, such as when one or more radio-frequency signals propagate along the radio-frequency signal route and one or more voltages and/or currents of the bipolar junction transistor 202 are controlled. While in some instances the variation may be a result of production variations of the bipolar junction transistor 202, such as the doping of the base region, emitter region, or collector region, in various other examples, operating conditions and temperature can have an effect on current gain values. Accordingly, in various implementations, the beta sensing circuit 104 continuously, dynamically, periodically, or on-demand, measures the current gain of the bipolar junction transistor 202. In contrast to some typical calibration techniques, which may measure process parameters at a testing station during, or immediately following, production, continuous, dynamic, periodic, and/or on-demand measurements enable adjustment of operation parameters once the integrated circuit has left the testing station and/or when the integrated circuit is in use. Such aspects and embodiments provide important functionality as often parameters may vary once the integrated circuit has been shipped and/or packaged within a device.

The control signal generated by the beta sensing circuit 104 is communicated to the reference control circuit 106, which derives an optimized value of an operation parameter of the semiconductor device (e.g., bipolar junction transistor 202) based on the received control signal. For example, in at least one implementation the operation parameter may be the optimized operating point of the semiconductor device 103. With reference to FIG. 2, this may include a direct current operating point of the bipolar junction transistor 202. Optimized operating points may be based on one or more predetermined optimal operating points for a range of current gain values of the semiconductor device 103.

Figure 3:
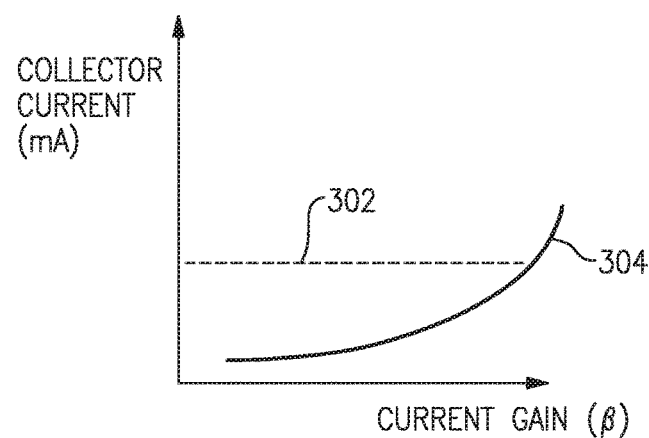
FIG. 3 is an example of the collector current of a semiconductor device plotted as a function of the current gain, according to various aspects described herein.

Referring to FIG. 3, illustrated is one example of a collector current of the bipolar junction transistor 202 plotted against a value of the current gain. In the illustrated example, the vertical axis represents the current at a collector terminal of the bipolar junction transistor 202, and the horizontal axis represents the corresponding value of the current gain. A first trace 302 represents a typical approach to stabilizing an operation parameter, where the collector current is held at a constant value, regardless of the current gain. As discussed above, this approach can limit the performance of the associated amplifier, and ignores the effects that the current gain variations may have on radio-frequency performance. Accordingly, in various aspects and embodiments, the operation parameter is continuously, dynamically, periodically, or on-demand adjusted based on the current gain. In FIG. 3, a second trace 304 shows the adjustments of the collector current (based on the current gain) to adjust the operating parameter. In the illustrated example, the collector current is increased as the current gain value increases. It should be noted that an optimized value of the operation parameter need not be a non-linear function of the current gain, as illustrated in FIG. 3, but may vary dependent on the desired performance characteristics of the radio-frequency power amplifier.

Returning to FIG. 2, responsive to receiving the control signal from the beta sensing circuit 104, the reference control circuit 106 adjusts the value of the operation parameter of the semiconductor device to achieve the optimized value. For example, the reference control circuit 106 may adjust the current at the collector terminal of the bipolar junction transistor 202 to achieve an optimal direct current operating point of the bipolar junction transistor 202 based on a given current gain. That is, the reference control circuit 106 may increase or decrease the collector current to cause an increase or decrease in the operation parameter (e.g., the direct current operating point). Accordingly, the reference control circuit 106 may increase or decrease the collector current until the operation parameter reaches the desired value.

In such an embodiment, the reference control circuit 106 may include an on-chip biasing circuit configured to receive a control signal (e.g., a bias control signal) from the beta sensing circuit 104. It should be appreciated that the collector current of the bipolar junction transistor 202 may be adjusted by varying a voltage applied to the collector terminal or the base terminal of the bipolar junction transistor 202. Adjustments by the reference control circuit 106 may be continuous, dynamic, periodic, on-demand, and/or performed at substantially the same frequency of a sample period of the beta sensing circuit. That is, in various embodiments the reference control circuit 106 adjusts the operation parameter of the bipolar junction transistor 202 in response to each control signal received. In such an example, this loop of measuring a current gain, and adjusting an operation parameter, is repeated to maintain certain performance levels of the semiconductor device regardless of the variation in current gain.

In certain examples, the beta sensing circuit 104 and the reference control circuit 106 may be packaged within the same integrated circuit as the radio-frequency power amplifier 102 and the associated at least one semiconductor device 103 (e.g., bipolar junction transistor 202). Specifically, the beta sensing circuit 104, the reference control circuit 106, the radio-frequency power amplifier 102, and the semiconductor device 103 may be positioned on a shared substrate (i.e., on the same chip, referred to herein as "on-chip"). However, in various other examples the beta sensing circuit 104 and/or the reference control circuit 106 may be included within a shared or separate circuit module which is physically separate, but electrically coupled, to the radio-frequency power amplifier 102 and the associated semiconductor device. That is, the beta sensing circuit 104 and the reference control circuit 106 may be packaged within separate circuit modules. Such examples are discussed in further detail below with reference to FIG. 5 and FIG. 6.

Accordingly, aspects and examples discussed herein permit on-chip current gain measurements, allowing the measured and adjusted semiconductor device to dynamically achieve an optimal operating state. Further, as the beta-sensing circuit 104 and the reference control circuit 106 may be may be included within a packaged integrated circuit that includes the radio-frequency power amplifier 102, the proposed arrangements may be implemented with purely analog components. Such an arrangement offers a simple topology which removes the need for non-volatile memory or associated digital circuitry to adjust the operation parameter of the associated semiconductor device (e.g., bipolar junction transistor 202) and/or design parameters of the radio-frequency power amplifier 102 (e.g., linearity, signal to noise ratio, power consumption, etc.).

Figure 4:
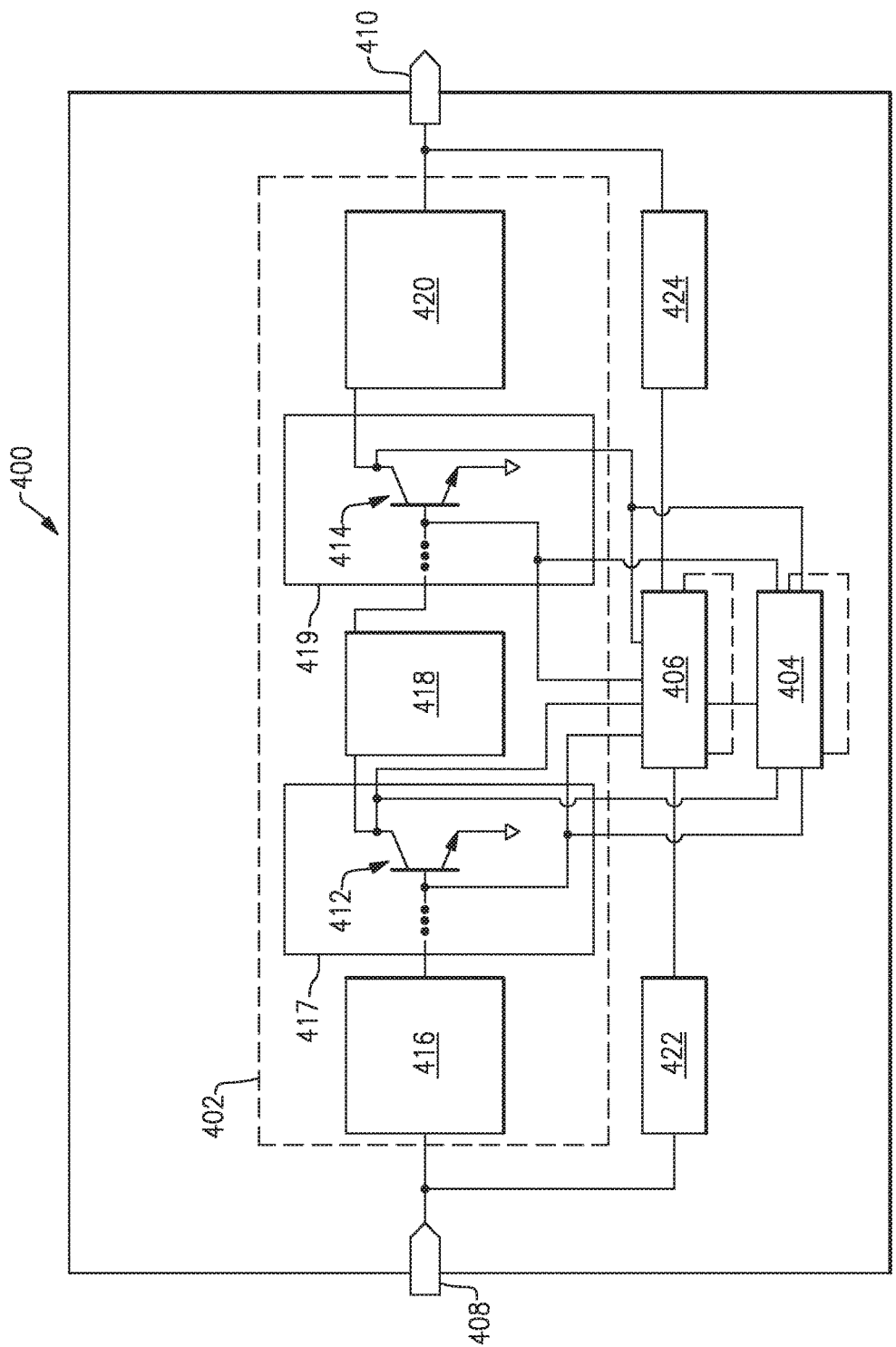
FIG. 4 is a circuit diagram illustrating one example of a power amplifier circuit according to various aspects described herein.

Turning now to FIG. 4, illustrated is a circuit diagram illustrating one example of a power amplifier circuit 400 according to aspects of the present disclosure. In the illustrated example, the power amplifier circuit 400 includes a radio-frequency signal route from an input path 408 to an output path 410. Coupled along the radio-frequency signal route is an integrated circuit 402 including a plurality of circuit stages. As illustrated, the plurality of circuit stages may include one or more impedance matching networks and one or more gain stages, each with an associated semiconductor device, such as an output stage transistor. Specifically, in the example of FIG. 4, the circuit 402 includes an input impedance matching network 416, a first gain stage 417 including an associated output transistor (e.g., a first bipolar junction transistor 412), an interstage impedance matching network 418, a second gain stage 419 including an associated output transistor (e.g., a second first bipolar junction transistor 414), and an output matching impedance network 420. In various embodiments, a radio-frequency signal applied along the radio-frequency signal route is sequentially amplified by each gain stage of the integrated circuit 402 providing an amplified radio-frequency signal at the output path 410.

In the illustrated example, the first gain stage 417 and a base terminal of the first bipolar junction transistor 412 are electrically coupled to input matching impedance network 416, the first gain stage 417 and a collector terminal of the first bipolar junction transistor 417 are electrically coupled to the interstage impedance matching network 418, and an emitter terminal of the first bipolar junction transistor 412 is coupled to a signal ground. As further illustrated, the second gain stage 419 and a base terminal of the second bipolar junction transistor 414 are electrically coupled to the interstage impedance matching network 418, the second gain stage 419 and a collector terminal of the bipolar junction transistor 414 are electrically coupled to the output matching impedance network 420, and an emitter terminal of the second bipolar junction transistor 414 is electrically coupled to a signal ground, which may be a shared signal ground between the first bipolar junction transistor 412 and the second bipolar junction transistor 414.

The input matching impedance network 416 is further shown coupled to the input path of the circuit 408, and the output matching impedance network 420 is further coupled to the output path 410 of the power amplifier circuit 400. As further discussed with reference to FIG. 1, the beta sensing circuit 404 and the reference control circuit 406 are electrically coupled to each other and to each of the first and second bipolar junction transistors 412, 414. In certain examples, each of the gain stages 417, 419 may include additional circuit components not shown in FIG. 4 for the convenience of description.

In the illustrated example of FIG. 4, the beta sensing circuit 404 is coupled to the base terminal and the collector terminal of each of the first bipolar junction transistor 412 and the second bipolar junction transistor 414. Similarly, the reference control circuit 406 is coupled to the base terminal and the collector terminal of each of the first bipolar junction transistor 412 and the second bipolar junction transistor 414. In various embodiments, the beta sensing circuit 404 measures a current gain of the first bipolar junction transistor 412 and generates a corresponding control signal based at least in part on the value of the current gain measured. Similarly, the beta sensing circuit 404 measures a current gain of the second bipolar junction transistor 414 and generates a corresponding control signal based at least in part on the value of the current gain measured. Although a single beta sensing circuit 404 that measures the current gain of each of the bipolar junction transistors 412, 414 is shown in FIG. 4, it should be appreciated that separate beta sensing circuits may alternatively be provided, with each sensing the current gain of a respective bipolar junction transistor 412, 414 (as illustrated in phantom in FIG. 4).

In various embodiments, the control signal corresponding to the first bipolar junction transistor 412 can be physically distinct or differ in value from the control signal corresponding to the second bipolar junction transistor 414. Measurements may be performed simultaneously or consecutively depending on application demands. In at least one example, and as illustrated, the first and second bipolar junction transistors 412, 414 include NPN-type bipolar junction transistors. Accordingly, in various embodiments the beta sensing circuit 404 includes one of a current sensing circuit, voltage sensing circuit, or charge sensing circuit coupled to the bipolar junction transistors 412, 414 and configured to measure the ratio of the collector current and the base current of the first bipolar junction transistor 412 and the second bipolar junction transistor 414. The bipolar junction transistors 412, 414 of two gain stages 417, 419 are illustrated for the convenience of illustration. However, in various examples the power amplifier circuit 400 may include additional gain stages. That is, the power amplifier circuit 400 may include any suitable number of gain stages and/or impedance matching networks.

In various implementations, the beta sensing circuit 404 continuously, dynamically, periodically, or on-demand, measures the current gain of the first bipolar junction transistor 412 and/or the second bipolar junction transistor 414. In contrast to some typical calibration techniques, which may measure process parameters at a testing station during or immediately following fabrication, continuous, dynamic, periodic, and/or on-demand measurements enable adjustment once the integrated circuit has left the testing station and when the integrated circuit is in use. Such aspects and embodiments provide important functionality as often parameters drift during operation.

For example, the control signal generated by the beta sensing circuit 404 is communicated to the reference control circuit 406, which derives an optimized value of an operation parameter of each of the semiconductor devices 412, 414 based on the corresponding control signal. For example, in at least one implementation the operation parameter of each semiconductor device may be the optimal operating point of that semiconductor device based on the present current gain value. With reference to FIG. 3, this may include a direct current operating point of the first bipolar junction transistor 412 and/or a direct current operating point of the second bipolar junction transistor 414. Optimized operating points may be based on one or more predetermined optimal operating points for a range of current gain values. Responsive to receiving the control signal from the beta sensing circuit 404, the reference control circuit 406 adjusts the operation parameter of the corresponding semiconductor device to achieve the optimized value.

The reference control circuit 406 may adjust the current at the collector terminal of the first bipolar junction transistor 412 to achieve an optimal direct current operating point of the first bipolar junction transistor 412 based on a given current gain. Similarly, the reference control circuit 406 may adjust the current at the collector terminal of the second bipolar junction transistor 414 to achieve the optimal direct current operating point of the second bipolar junction transistor 414. It should be appreciated that the functionality of the reference control circuit 406 may be provided by separate reference control circuits, each controlling a respective bipolar junction transistor 412, 414 (as illustrated in phantom). Adjustments by the reference control circuit 406 may be continuous, dynamic, periodic, on-demand, and/or performed at substantially the same frequency of a sample period of the beta sensing circuit 404. That is, in various embodiments the reference control circuit adjusts the operation parameter of the first and/or second bipolar junction transistor 412, 414 in response to each control signal received. In such an example, this loop of measuring a current gain, and adjusting an operation parameter, is repeated to maintain certain performance levels of the semiconductor device. Accordingly, in various embodiments the power amplifier circuit 400 achieves optimal operation parameters for each component device within a range of current gains regardless of the current gain. That is, in such embodiments the power amplifier circuit 400 does not require a compromise of operation conditions across process corners.

As discussed above, dynamic, continuous, and/or on-demand control of the one or more operation parameters may also be used to improve the design of the associated amplifier circuit, such as the power amplifier circuit 400. In certain examples, the circuit 400 can include a predistortion circuit 422 electrically coupled to at least the beta sensing circuit 404. The predistortion circuit 422 may receive one or more of the control signals from the beta sensing circuit 404 and cancel a non-linear effect of the power amplifier circuit 400. In certain examples, the predistortion circuit 422 may include a radio-frequency predistortion linearizer configured to substantially reduce the non-linear effect of the power amplifier circuit 400 based on the measured value of the current gain. The predistortion circuit 422 may improve the linearity and reduce the overall distortion of the power amplifier circuit 400 by inversely modeling the phase characteristics and gain of the power amplifier circuit 400. While in one example, the predistortion circuit 422 may include analog circuit components, in various other examples the predistortion circuit 422 is implemented digitally using suitable digital predistortion techniques.

In certain examples, the circuit 400 may include an envelope tracking circuit 424, which can be used to provide a varying amount of power to the power amplifier circuit 400. For instance, the envelope tracking circuit 424 may vary a supply voltage or current based on an amplitude envelope of the radio-frequency signal for more efficient operation. In addition, the envelope tracking circuit 424 may cancel the non-linear effect of the power amplifier circuit 400 based on the measured value of the current gain, and in response to receiving the control signal from the beta sensing circuit 402. While in one example, the envelope tracking circuit 404 may include analog circuit components, in various other examples the envelope tracking circuit 424 is implemented digitally using suitable digital envelope tracking techniques.

The envelope tracking circuit 424 may be coupled to a battery, for example, and configured to vary the voltage or current provided to the power amplifier circuit 400 based on the amplitude envelope of the radio-frequency signal. In such embodiments, the battery may be any suitable battery for use within a wireless device. For example, the battery may include a lithium-ion battery. Continuous adjustments of the voltage provided to the power amplifier circuit 400 ensure that the power amplifier circuit 400 operates at a peak efficiency during each instance of performance. The amplitude envelope signal may be provided to the envelope tracking circuit 424 from a transceiver of an associated device. However, in various other examples the amplitude envelope signal may be determined and provided by any suitable envelope tracker and may be based on the amplitude of the output radio-frequency signal.

Figure 5:
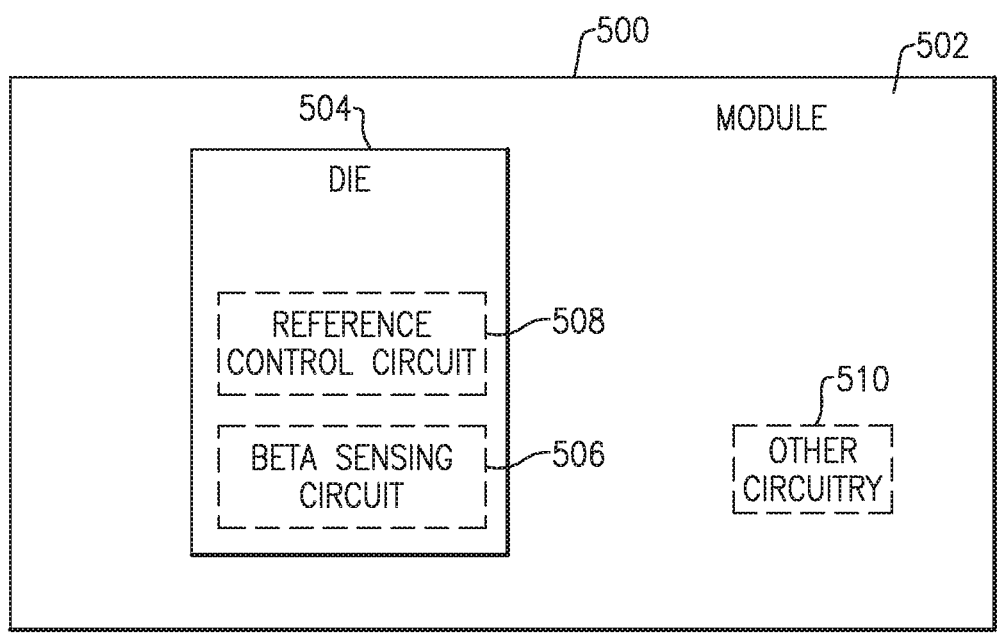
FIG. 5 is a block diagram of one example of a radio-frequency module including according to various aspects described herein.

As discussed above, examples of the integrated circuit 100 illustrated in FIG. 2 and power amplifier circuit 400 illustrated in FIG. 4 can be packaged, either alone or together with other circuitry, as a module that can be incorporated into an electronic device, such as a mobile communications device. With reference to FIG. 2, while in one embodiment the beta sensing circuit 104, the reference control circuit 106, and the one or more semiconductor device 103 may be packaged within the same module, in various embodiments the beta sensing circuit 104 and reference control circuit 106 may be packaged in a separate module. FIG. 5 is a block diagram of one example of a module 500 that can include an embodiment of the beta sensing circuit 104 and the reference control circuit 106.

In the illustrated example, the module 500 includes a packaging substrate 502 that is configured to receive a plurality of components. In some embodiments, such components can include a die 504 having components of the beta sensing circuit 506 and/or reference control circuit 508 described herein. In some embodiments, other circuitry or components 510 can be mounted on or formed on the packaging substrate 502. In some embodiments, the packaging substrate 502 can include a laminate substrate. In some embodiments, the module 500 can also include one or more packaging structures to, for example, provide protection and facilitate easier handling of the module 500. Such a packaging structure can include an overmold formed over the packaging substrate 502 and dimensioned to substantially encapsulate the various dies and components thereon. As discussed above, it will be understood that although the module 500 is described in the context of wirebond-based electrical connections, one or more features of the present disclosure can also be implemented in other packaging configurations, including flip-chip configurations, as discussed above.

Figure 6:
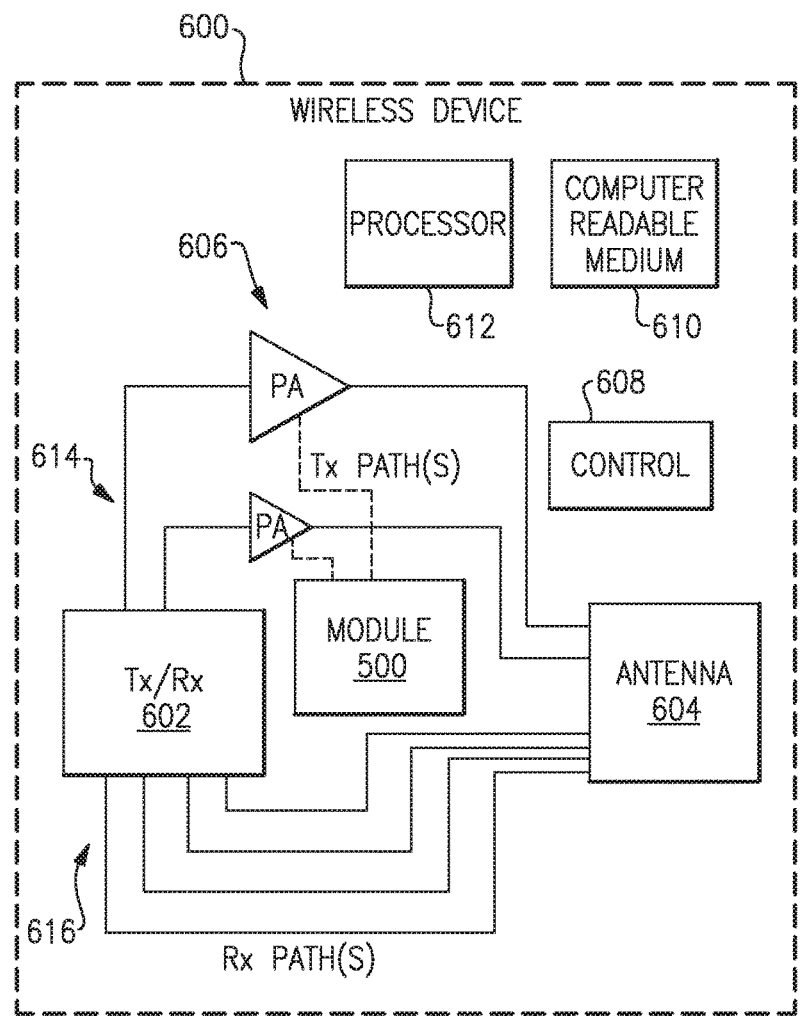
FIG. 6 is a block diagram of one example of a wireless device in which embodiments of a beta sensing circuit and a reference control circuit can be used, according to various aspects described herein.

FIG. 6 is a block diagram of one example of a wireless communications device 600 in which the example module 500 of FIG. 5 can be used. The example wireless device 600 can be a mobile phone, such as a smart phone, for example. By way of example, the wireless device 600 can communicate in accordance with Long Term Evolution (LTE). In this example, the wireless device 600 can be configured to operate at one or more frequency bands defined by an LTE standard. The wireless device 600 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 6, the wireless device 600 can include a transceiver 602, an antenna 604, power amplifiers 606, a control component 608, a computer readable storage medium 610, and at least one processor 612. The module 500 can be electrically coupled to one or more components of the of the power amplifiers 606, as discussed above with reference to at least the examples of FIG. 2 and FIG. 4. As will be appreciated by those skilled in the art, the wireless device 600 can include elements that are not illustrated in FIG. 6 and/or a sub-combination of the illustrated elements.

The transceiver 602 can generate radio-frequency signals for transmission via the antenna 604. Furthermore, the transceiver 602 can receive incoming radio-frequency signals from the antenna 604. It will be understood that various functionalities associated with transmitting and receiving of radio-frequency signals can be achieved by one or more components that are collectively represented in FIG. 6 as the transceiver 602. For example, a single component can be configured to provide both transmitting and receiving functionalities. In another example, transmitting and receiving functionalities can be provided by separate components.

In FIG. 6, one or more output signals from the transceiver 602 are depicted as being provided to the antenna 604 via one or more transmission paths 614. In the example illustrated, different transmission paths 614 can represent output paths associated with different frequency bands (e.g., a high band and a low band) and/or different power outputs. Similarly, one or more signals from the antenna 604 are depicted as being provided to the transceiver 602 via one or more receive paths 616. In the example illustrated, different receive paths 616 can represent paths associated with different signaling modes and/or different receive frequency bands. The wireless device 600 can be adapted to include any suitable number of transmission paths 614 or receive paths 616. The transmission paths 614 can include one or more power amplifiers 606 to aid in boosting a radio-frequency signal having a relatively low power to a higher power suitable for transmission.

As discussed above, the one or more power amplifiers 606 may be electrically coupled to one or more terminals on the module 500. Specifically, the beta sensing circuit and the reference control circuit positioned on the die of the module 500 may be electrically coupled to a semiconductor device of each power amplifier 606. As discussed above, according to certain embodiments, the module 500 can facilitate optimization of an operation parameter, such as an operating point, based on a measured value of current gain. In certain embodiments, the control component 608 can be provided for controlling various control functionalities associated with operations of the module 500 and/or other operating component(s). The control component 608 can be connected to the reference control circuit of the module 500, for example.

In certain embodiments, the at least one processor 612 can be configured to facilitate implementation of various processes on the wireless device 600. The at least one processor 612 can be, for example, implemented using hardware, software, or a combination of hardware and software. For instance, the at least one processor 612 may include one or more microprocessors or other types of controllers that can perform a series of instructions that manipulate data. However, in other examples the processor 612 may include specially-programmed, special-purpose hardware, such as for example, an application-specific integrated circuit (ASIC) tailored to perform a particular operations disclosed herein. In certain implementations, the wireless device 600 can include a non-transitory computer readable medium 610, such as a memory, which can store computer program instructions that may be provided to and executed by the at least one processor 612.

Some of the embodiments described above have provided examples in connection with mobile devices. However, the principles and advantages of the embodiments can be used for any other systems or apparatus, such as any uplink cellular device, that could benefit from any of the circuits described herein. Any of the principles and advantages discussed herein can be implemented in an electronic system that uses power amplifiers. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

Figure 7:
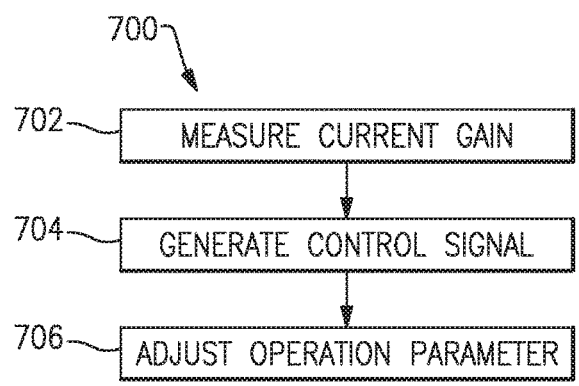
FIG. 7 is a process flow illustrating one example of a process for adjusting an operation parameter of a semiconductor device, according to various aspects described herein.

As described above with reference to at least FIGS. 1-4, several embodiments perform processes that adjust one or more operation parameter of a semiconductor device (e.g., a bipolar junction transistor integrated within an output stage of a radio-frequency power amplifier) based on (e.g., as a function of) a measured current gain value. In some embodiments, these processes are executed by components of an integrated circuit, such as the integrated circuit 100 described above with reference to FIG. 2. One example of such a process is illustrated in FIG. 7. FIG. 7 is described with continuing reference to components of the integrated circuit 100 shown in FIG. 2.

In the illustrated example, the process 700 may include the acts of measuring a current gain, generating a control signal, and adjusting an operation parameter based on a value of the measured current gain. In act 702, the example process 700 includes measuring the current gain of at least one semiconductor device. As discussed above with reference to at least FIG. 2, often the current gain of the transistor device (e.g., bipolar junction transistor 202) will vary during operation of the integrated circuit, such as when one or more radio-frequency signal propagates along the radio-frequency signal route and one or more voltages and/or currents of the device are controlled. Accordingly, in various implementations, the process 700 includes continuously, dynamically, or periodically measuring the current gain of the semiconductor device. In various other examples, current gain measurements may be performed on-demand. For example, in response to one or more measurement command signals received from a device controller.

In act 704, once a current gain value has been measured, the process 700 may include generating a control signal based at least in part on a value of the current gain of the at least one semiconductor device. For example, the control signal may include an analog control signal. The beta sensing circuit may then communicate the control signal to the reference control circuit. Once received at the reference control circuit, in act 706 the process 700 may include adjusting an operation parameter of the at least one semiconductor device at least based on the value of the current gain.

In certain embodiments, adjusting the operation parameter of the at least one semiconductor device includes adjusting a direct current operating point of the semiconductor device. For example, this may include adjusting at least one of a current and a voltage provided to the semiconductor device. As discussed above with reference to at least FIG. 2, the semiconductor device may include a bipolar junction transistor. Accordingly, in act 706 adjusting at least one of a current and a voltage provided to the first semiconductor device may include adjusting a variable collector current of the first semiconductor device.

While not explicitly illustrated in the example process flow of FIG. 7, in various embodiments the process 700 may include additional acts and processes. Such acts and process are discussed above in further detail with regards to the integrated circuit shown in FIG. 2, and the example power amplifier circuit shown in FIG. 4.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure.

Accordingly, the foregoing description and drawings are by way of example only, and the scope of the disclosure should be determined from proper construction of the appended claims, and their equivalents.

What is claimed is:

1. An integrated circuit comprising:
a first bipolar junction transistor having a base, a collector, and an emitter;
a beta sensing circuit coupled to the base and the collector of the first bipolar junction transistor and configured to measure a current gain of the first bipolar junction transistor and generate a first control signal based on a value of the current gain of the first bipolar junction transistor; and
a reference control circuit coupled to the beta sensing circuit and configured to receive the first control signal and adjust an operation parameter of the first bipolar junction transistor based on the value of the current gain of the first bipolar junction transistor.

2. The integrated circuit of claim 1 wherein the first bipolar junction transistor is an NPN-type bipolar junction transistor.

3. The integrated circuit of claim 2 wherein the reference control circuit is a biasing circuit integrated within a shared substrate with the NPN-type bipolar junction transistor, the biasing circuit being configured to adjust a direct current operating point of the NPN-type bipolar junction transistor.

4. The integrated circuit of claim 3 wherein the biasing circuit is configured to adjust a variable collector current of the NPN-type bipolar junction transistor to adjust the direct current operating point of the NPN-type bipolar junction transistor.

5. The integrated circuit of claim 4 wherein the NPN-type bipolar junction transistor is a common-emitter NPN-type bipolar junction transistor integrated within a radio-frequency signal path of an output stage of a radio-frequency power amplifier.

6. The integrated circuit of claim 1 wherein the beta sensing circuit is configured to continuously measure the current gain of the first bipolar junction transistor.

7. The integrated circuit of claim 6 wherein the reference control circuit is configured to continuously adjust the operation parameter of the first bipolar junction transistor based on the value of the continuously measured current gain of the first bipolar junction transistor.

8. The integrated circuit of claim 1 wherein the beta sensing circuit is configured to periodically measure the current gain of the first bipolar junction transistor.

9. The integrated circuit of claim 8 wherein the reference control circuit is configured to periodically adjust the operation parameter of the first bipolar junction transistor based on the value of the periodically measured current gain of the first bipolar junction transistor.

10. The integrated circuit of claim 1 further comprising a second bipolar junction transistor, the beta sensing circuit being further configured to measure a current gain of the second bipolar junction transistor and generate a second control signal based on a value of the current gain of the second bipolar junction transistor.

11. The integrated circuit of claim 10 wherein the reference control circuit is further configured to receive the second control signal and adjust an operation parameter of the second bipolar junction transistor based on the value of the current gain of the second bipolar junction transistor, the second control signal being different from the first control signal.

12. The integrated circuit of claim 1 wherein the reference control circuit is configured to provide at least one of a current and a voltage to the first bipolar junction transistor.

13. A radio-frequency power amplifier circuit comprising:
an input path configured to receive an input radio-frequency signal;
an integrated circuit coupled to the input path and configured to generate an amplified radio-frequency signal, the integrated circuit including at least a first circuit stage coupled to a second circuit stage, the first circuit stage including a first bipolar junction transistor having a first base, a first collector, and a first emitter, and the second circuit stage including a second bipolar junction transistor having a second base, a second collector, and a second emitter;
at least one beta sensing circuit coupled to the first base, the first collector, the second base, and the second collector, and configured to measure a first current gain of the first bipolar junction transistor, generate a first control signal based on a value of the first current gain, measure a second current gain of the second bipolar junction transistor, and generate a second control signal based on a value of the second current gain;
at least one reference control circuit configured to receive the first control signal and the second control signal, adjust a first operation parameter of the first bipolar junction transistor based on the value of the first current gain, and adjust a second operation parameter of the second bipolar junction transistor based on the value of the second current gain; and
an output path coupled to the integrated circuit and configured to provide the amplified radio-frequency signal.

14. The radio-frequency power amplifier circuit of claim 13 wherein the first control signal is different from the second control signal.

15. The radio-frequency power amplifier circuit of claim 13 wherein the first circuit stage and the second circuit stage are integrated within a shared substrate of the integrated circuit.

16. The radio-frequency power amplifier circuit of claim 13 wherein the first bipolar junction transistor is a first NPN-type first bipolar junction transistor and the second bipolar junction transistor is a second NPN-type bipolar junction transistor.

17. The radio-frequency power amplifier circuit of claim 16 wherein the reference control circuit is a biasing circuit configured to adjust a first direct current operating point of the first NPN-type bipolar junction transistor and adjust a second direct current operating point of second NPN-type bipolar junction transistor.

18. The radio-frequency power amplifier circuit of claim 17 wherein the at least one biasing circuit is configured to adjust a first variable collector current of the first NPN-type bipolar junction transistor to adjust the first direct current operating point, and adjust a second variable collector current of the second NPN-type bipolar junction transistor to adjust the second direct current operating point.

19. The radio-frequency power amplifier circuit of claim 13 further comprising a predistortion circuit coupled to at least the at least one beta sensing circuit and configured to cancel a non-linear effect of the radio-frequency power amplifier circuit in response to receiving at least one of the first control signal and the second control signal.

20. The radio-frequency power amplifier circuit of claim 13 further comprising an envelope tracking circuit coupled to at least the at least one beta sensing circuit and configured to cancel a non-linear effect of the radio-frequency power amplifier circuit in response to receiving at least one of the first control signal and the second control signal.

21. An amplifier biasing method, the method comprising:
sensing at least one of a voltage value and a current value at each of a collector and a base of at least one bipolar junction transistor integrated within a radio-frequency signal path of an output stage of a radio-frequency power amplifier;
determining a current gain of the at least one bipolar junction transistor based on the at least one of the voltage value and the current value at each of the collector and the base;
generating a control signal based on a value of the current gain of the at least one bipolar junction transistor; and
adjusting an operation parameter of the at least one bipolar junction transistor based on the value of the current gain responsive to receiving the control signal.

22. The method of claim 21 wherein adjusting an operation parameter of the at least one bipolar junction transistor includes adjusting a direct current operating point of the at least one bipolar junction transistor.

23. The method of claim 22 wherein adjusting the direct current operating point of the at least one bipolar junction transistor includes adjusting at least one of a current and a voltage provided to the at least one bipolar junction transistor.

24. The method of claim 23 wherein adjusting at least one of a current and a voltage provided to the at least one bipolar junction transistor includes adjusting a variable collector current of the at least one bipolar junction transistor.

25. The method of claim 21 wherein determining the current gain of the at least one bipolar junction transistor includes one of continuously determining the current gain of the at least one bipolar junction transistor and periodically determining the current gain of the at least one bipolar junction transistor.

* * * * *